US009404981B2

(12) United States Patent
Hierl et al.

(10) Patent No.: US 9,404,981 B2
(45) Date of Patent: Aug. 2, 2016

(54) MAGNETIC RESONANCE APPARATUS WITH A NOISE PREVENTION ELEMENT AND A MOLD APPARATUS FOR PRODUCING THE NOISE PREVENTION ELEMENT

(71) Applicants: Andreas Hierl, Veitsbronn (DE); Bernd Maciejewski, Markt Erlbach (DE)

(72) Inventors: Andreas Hierl, Veitsbronn (DE); Bernd Maciejewski, Markt Erlbach (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 734 days.

(21) Appl. No.: 13/717,770

(22) Filed: Dec. 18, 2012

(65) Prior Publication Data
US 2013/0162254 A1  Jun. 27, 2013

(30) Foreign Application Priority Data

Dec. 21, 2011 (DE) .......................... 10 2011 089 332

(51) Int. Cl.
*G01R 33/28* (2006.01)
*G01R 33/385* (2006.01)

(52) U.S. Cl.
CPC ............ *G01R 33/28* (2013.01); *G01R 33/3854* (2013.01)

(58) Field of Classification Search
USPC .......................... 324/300–322; 600/407–435; 382/128–131
See application file for complete search history.

(56) References Cited

U.S. PATENT DOCUMENTS

| 5,235,283 | A | 8/1993 | Lehne et al. |
| 5,238,215 | A * | 8/1993 | Jeker et al. ..................... 248/638 |
| 6,414,489 | B1 * | 7/2002 | Dean ................... G01R 33/3854 324/318 |
| 6,831,461 | B2 * | 12/2004 | Arz et al. ........................ 324/318 |
| 7,131,640 | B2 * | 11/2006 | Knowles et al. ............... 267/136 |
| 7,398,964 | B2 * | 7/2008 | Knowles et al. ............... 267/136 |
| 7,451,966 | B1 * | 11/2008 | Knowles et al. ............... 267/136 |
| 2003/0025582 | A1 * | 2/2003 | Arz et al. ....................... 335/296 |
| 2005/0156367 | A1 * | 7/2005 | Knowles et al. ............ 267/140.4 |
| 2005/0161871 | A1 * | 7/2005 | Knowles et al. ............ 267/140.4 |
| 2005/0189687 | A1 * | 9/2005 | Knowles et al. ............ 267/141.1 |
| 2008/0230970 | A1 * | 9/2008 | Knowles et al. ............... 267/141 |
| 2013/0162254 | A1 * | 6/2013 | Hierl et al. ..................... 324/319 |

FOREIGN PATENT DOCUMENTS

| CN | 101061390 A | 10/2007 |
| DE | 69122804 T2 | 3/1997 |
| DE | 102010029472 A1 | 12/2011 |

\* cited by examiner

*Primary Examiner* — Melissa Koval
*Assistant Examiner* — Tiffany Fetzner

(57) ABSTRACT

A magnetic resonance apparatus includes a magnet unit and a housing unit enclosing the magnet unit. A noise prevention unit is provided which is arranged between the magnet unit and the housing unit enclosing the magnet unit and which has at least one noise prevention element made of an insulating foam. The at least one noise prevention element has a D-shaped cross-sectional area.

16 Claims, 5 Drawing Sheets

Legend:
10: magnetic resonance apparatus
11: magent unit
12: main magnet
17: housing unit
30: noise prevention unit
31: interspace between 17 and 11
32: noise prevention element
33: cross-sectional area of 32
34: U-shaped subregion of 32
35: bar-shaped subregion of 32
42: fixing surface
43: surface of 17 facing 11
45: noise prevention barrier
47: junction of 17
48: side covering of 17
49: front side of 17

Legend:
10: magnetic resonance apparatus
17: housing unit
30: noise prevention unit
32: noise prevention element
33: cross-sectional area of 32
34: U-shaped subregion of 32
35: bar-shaped subregion of 32
36: central recess of 32
37: connecting region
38: bonding point
39: width
40: height
41: wall thickness
42: fixing surface
45, 46: noise prevention barrier
47: junction of 17
48: side covering of 17
49: front side of 17
50: junction
51: patient bore Legend:
30: noise prevention unit
32: noise prevention element
44: longitudinal extension
45, 46: noise prevention barrier
49: front side of housing unit
52: rear region of housing unit Legend:
100: mold apparatus
101: lower mold
102: upper mold
103: cavity
104: insert mold
105: cross-sectional area of 104
106: cross-sectional area of 103
107: distance
108: separating land
109: overall syrface

MAGNETIC RESONANCE APPARATUS WITH A NOISE PREVENTION ELEMENT AND A MOLD APPARATUS FOR PRODUCING THE NOISE PREVENTION ELEMENT

CROSS REFERENCE TO RELATED APPLICATIONS

This application claims priority of German Patent Office application No. 102011089332.6 DE filed Dec. 21, 2011. All of the applications are incorporated by reference herein in their entirety.

FIELD OF INVENTION

The illustrated embodiments relate to a magnetic resonance apparatus comprising a magnet unit, a housing unit enclosing the magnet unit and a noise prevention unit arranged between the magnet unit and the housing unit enclosing the magnet unit and which comprises at least one noise prevention element made of insulating foam.

BACKGROUND OF INVENTION

Loud operating noises are generated in magnetic resonance systems as a result of interactions between a gradient coil unit and a main magnet. Starting from the gradient coil unit, the loud operating noises are propagated in a radial direction toward the exterior and/or interior, the sound being, for example, propagated in an air gap between a magnet unit comprising the gradient coil unit and the main magnet and a housing unit enclosing the magnet unit.

Noise prevention units having noise prevention elements for containing the sound propagation within the magnetic resonance apparatus are already known, the noise prevention elements being embodied in a rod and/or cuboid shape and being formed entirely from flexible foam and/or insulating foam. However, prior to the installation and/or arrangement of the noise prevention elements between the magnet unit and the housing unit, complicated and time-consuming manual cutting operations must be carried out on the noise prevention elements by a installation technician in order to enable said noise prevention elements to be actually positioned between the magnet unit and the housing unit. In this case, however, deviations between a magnetic center and a geometric center of the magnet unit can give rise to tolerances of ±0.5 cm with respect to a position of the gradient coil unit in relation to the position of the main magnet. These tolerances should be compensated by the noise prevention elements. In this case, however, in particular when an edge region is being sealed off, unwanted air gaps can form between the housing unit and the magnet unit. In addition, these noise prevention elements are only able to absorb a force acting on the noise prevention elements to an inadequate extent and consequently transmit said force onward to the housing unit, for example, which can result in unwanted deformations of individual housing shells of the housing unit.

If, in addition, the noise prevention elements are intended to be used for different magnetic resonance apparatuses, this can result in an enlargement of the tolerance zone which is to be compensated by the noise prevention elements. In this case it is important that the noise prevention elements do not build up and pass on any pressure in a lower limit region of the tolerance zone between the gradient coil unit and the main magnet and nevertheless still ensure effective sealing in order to reduce the sound propagation in an upper limit region of the tolerance zone.

SUMMARY OF INVENTION

An object herein is to provide a magnetic resonance apparatus with a noise prevention element that generates a minimal compressive force between the magnet unit and the housing shell unit and yet provides an effective barrier against sound propagation.

The object is achieved by the features of the independent claim(s). Specific embodiments are described in the dependent claims.

Another object herein is to provide a mold apparatus for producing a D-shaped noise prevention element which permits particularly cost-effective and simple production of the D-shaped noise prevention element. The object is achieved by means of the features of claim 14.

The illustrated embodiments relate to a magnetic resonance apparatus comprising a magnet unit, a housing unit enclosing the magnet unit and a noise prevention unit which is arranged between the magnet unit and the housing unit enclosing the magnet unit and which comprises at least one noise prevention element made of insulating foam.

It is proposed that the at least one noise prevention element have a D-shaped cross-sectional area, thus enabling an effective noise prevention barrier to be provided during the operation of the magnetic resonance apparatus. The D-shaped cross-sectional area enables an interspace between the magnet unit and the housing unit to be embodied as soundproof so that sound propagation within this interspace is at least reduced and/or prevented. A D-shaped cross-sectional area of the noise prevention element shall in particular be understood to mean a cross-sectional area having a rectangular basic shape with two rounded corners, the two rounded corners being arranged adjacent to each other. In addition, the D-shaped cross-sectional area has a central recess so that a border of the recess is embodied in a D shape. The D-shaped cross-sectional area of the noise prevention element enables the noise prevention element to be used for different gap distances between the magnet unit and the housing unit, since, owing to the D-shaped cross-sectional area, a force acting on the noise prevention element can be absorbed by the noise prevention element and at least partially compensated. In this way a compressive force acting in the noise prevention element due to the application of force onto the noise prevention element can be minimized The compressive force may, for example, act perpendicularly to a longitudinal extension of the noise prevention element such that in the case of a strong force acting on the noise prevention element, for example, the noise prevention element buckles instead of compressing or retransmitting said force. In addition, the transmission of a force acting on the noise prevention element to housing shell elements of the housing unit can in this case be reduced and/or prevented so that unwanted deformation of these housing shell elements can be prevented. The insulating foam can in this context comprise in particular flexible foam and/or viscoelastic foam and/or integral foam with in particular a low Shore hardness and/or other foams that appear advisable to the person skilled in the art.

It is also proposed that the at least one noise prevention element be constructed in a single piece, thereby enabling a particularly simple installation of the noise prevention element between the magnet unit and the housing unit to be achieved. In this context 'in a single piece' shall be understood to mean in particular that the noise prevention element is produced from one constituent part and/or one casting. In this case the noise prevention element may, for example, comprise a U-shaped subregion and a bar-shaped subregion, wherein the U-shaped subregion and the bar-shaped subregion are embodied in a single piece at a connecting region constructed in a single piece. Alternatively hereto it is also conceivable for the noise prevention element to comprise a U-shaped subregion and a bar-shaped subregion which are embodied separately from each other and which are bonded to each other to form the D-shaped noise prevention element prior to an installation step.

It is further proposed that the at least one noise prevention element have a U-shaped subregion, a bar-shaped subregion and two connecting regions between the U-shaped subregion and the bar-shaped subregion, wherein one of the two connecting regions has a bonding point between the U-shaped subregion and the bar-shaped subregion. A particularly inexpensive production of the noise prevention element can be achieved by this means in that, following a production step such as, for example, foaming, the noise prevention element can be removed particularly easily from a mold for producing the noise prevention element with the D-shaped cross-sectional area, wherein bonding is performed only following removal from the mold. This embodiment enables the achievement of a closed D-shape of the noise prevention element which is able to absorb a force acting on the noise prevention element, in particular a force acting substantially perpendicularly to a longitudinal extension of the noise prevention element, and yet still retain its shape in an installed position for soundproof insulation between the magnet unit and the housing unit.

In one embodiment, the at least one noise prevention element has a width of approximately 60 mm. For example, the width extends along a length of the bar-shaped subregion within the D-shaped cross-sectional area. In addition, in this case, the at least one noise prevention element can have a height of approximately 70 mm. In this context, approximately 60 mm or approximately 70 mm shall be understood to mean that the width and/or the height have a tolerance zone of maximum ±5% and particularly maximum ±2%.

It is also proposed that the at least one noise prevention element have a wall thickness of at least 10 mm so that an effective noise prevention barrier can be achieved by means of the noise prevention element between the magnet unit and the housing unit. For effective reduction and/or damping of the passage of sound by means of the noise prevention element, the noise prevention element should have a material thickness of, for example, 20 mm or more, that is to be penetrated by sound waves. As a result of the D-shaped embodiment of the noise prevention element there are accordingly two walls, each having a wall thickness of at least 10 mm, to oppose the sound waves.

In a further embodiment, it is proposed that the at least one noise prevention element have a fixing surface for attachment to a surface of the housing unit facing the magnet unit. This enables the at least one noise prevention element to be fixed in a secure manner, in particular so that it cannot shift, to the housing unit. In this case the noise prevention element with the D-shaped cross-sectional area may be advantageous in comparison with a noise prevention element with an O-shaped cross-sectional area or a U-shaped cross-sectional area, since the noise prevention element with the D-shaped cross-sectional area has a particularly large and in particular exactly predefined adherend surface enabling simple fixing to the housing unit. In contrast hereto, a noise prevention element having the U-shaped cross-sectional area would have to be fixed in a complicated way with both rods to the housing unit and a noise prevention element having the O-shaped cross-sectional area has no clear adherend surface, such that here there may be different heights for the noise prevention element following a bonding process. In one embodiment, the at least one noise prevention element is bonded to the fixing surface with the housing unit. Particularly, the fixing surface in this case comprises an outward-facing surface of a bar-shaped subregion of the at least one noise prevention element.

It is also proposed that the at least one noise prevention element have a U-shaped subregion and, by means of the U-shaped subregion, bears at least partially against the magnet unit, thus enabling a soundproof noise barrier to be achieved in an intermediate gap and/or interspace between the magnet unit and the housing unit. In addition, a force acting on the noise prevention element can be absorbed directly by the U-shaped subregion in this case, such as, for example, by a deformation of the U-shaped subregion, and in this way a transmission of force from the magnet unit and to the housing unit can be prevented.

A noise prevention barrier within an interspace and/or intermediate gap between the magnet unit and the housing shell unit, in particular along a circumferential direction of the magnet unit, can be achieved if the at least one noise prevention element has a curved shape along its longitudinal extension.

It is also proposed that the noise prevention unit have a plurality of noise prevention elements arranged to form a ring-shaped noise prevention barrier so that a closed noise prevention barrier can be achieved within an interspace and/or intermediate gap between the magnet unit and the housing unit. Particularly, in one embodiment, the ring-shaped noise prevention barrier may be arranged on an edge region and/or junction between a side covering and a front and/or rear side of the housing unit. In addition, the ring-shaped noise prevention barrier can also be arranged on an edge region and/or junction between a patient bore and a front and/or rear side of the housing unit.

The illustrated embodiments also relate to a mold apparatus for producing a D-shaped noise prevention element made of insulating foam, wherein the mold apparatus comprises a lower mold and an upper mold which, when in a closed position with respect to each other, produce a D-shaped cavity.

It is proposed that the mold apparatus have a D-shaped insert mold, wherein the D-shaped insert mold has a smaller D-shaped cross-sectional area than a cross-sectional area of the D-shaped cavity. The embodiment of the mold apparatus enables particularly simple and inexpensive production of the D-shaped noise prevention element to be achieved. In particular, further production steps can be saved in this case in that the D-shaped noise prevention element can be removed from the mold apparatus following a production step, such as, for example, foaming performed in the mold apparatus, in a single piece and in addition ready for use. In one embodiment, the D-shaped noise prevention element has a D-shaped cross-sectional area.

It is further proposed that the D-shaped insert mold be arranged centrally within the D-shaped cavity, thus enabling a uniform wall thickness of the D-shaped noise prevention element produced by means of the mold apparatus to be achieved and hence the achievement of uniform force absorption while avoiding an overloading of thin wall sections of the D-shaped noise prevention element.

In one embodiment, the D-shaped insert mold is arranged at a distance of at least 10 mm from the lower mold and/or the upper mold within the D-shaped cavity. This enables the production of a D-shaped noise prevention element which can form an effective noise prevention barrier within an interspace between the magnet unit and the housing unit.

It is also proposed that the D-shaped insert mold have a separating land passing through the D-shaped cavity at one point. This enables a particularly easy removal of the D-shaped noise prevention element from the mold apparatus in that the D-shaped noise prevention element is arranged in a foldable manner along the separating land and in this way the D-shaped noise prevention element can be pulled out of the D-shaped insert mold and/or over the D-shaped insert mold.

In one embodiment, the separating land comprises a parting surface, which, together with a non-curved surface of the D-shaped insert mold, forms a non-curved overall surface. In this way, the separating land can be arranged particularly easily on the D-shaped insert mold, for example by bonding to the non-curved surface. In one embodiment, the effect of the separating land in this case is that the D-shaped noise prevention element is substantially formed from a bar-shaped subregion which is enclosed within the mold apparatus by the lower mold and the non-curved surface of the D-shaped insert mold, and a U-shaped subregion which is enclosed within the mold apparatus by the upper mold and a curved surface of the D-shaped insert mold, and that a connecting point between the U-shaped subregion and the bar-shaped subregion is separated by the separating land.

BRIEF DESCRIPTION OF THE DRAWINGS

Further features and details may be derived from the exemplary embodiment described below and with reference to the drawings, in which.

DETAILED DESCRIPTION OF INVENTION

Figure 1:
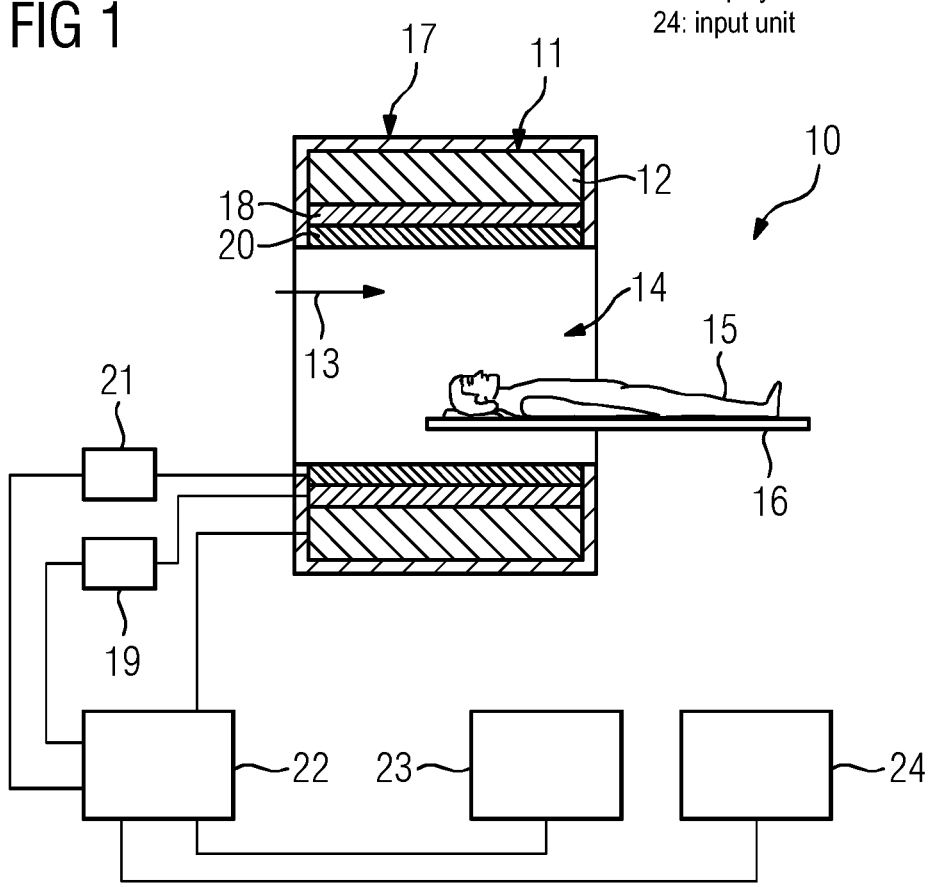
FIG. 1 shows a schematic view of a magnetic resonance apparatus.

FIG. 1 shows a schematic view of a magnetic resonance apparatus 10 according to one embodiment. The magnetic resonance apparatus 10 comprises a magnet unit 11 with a main magnet 12 for generating a strong and in particular constant main magnetic field 13. In addition, the magnetic resonance apparatus 10 has a cylindrical receiving region 14 for receiving a patient 15, wherein the receiving region 14 is enclosed by the magnet unit 11 in a circumferential direction. The patient 15 can be introduced into the receiving region 14 by means of a patient couch 16 of the magnetic resonance apparatus 10. Toward that end the patient couch 16 is arranged movably inside the magnetic resonance apparatus 10. In addition, the magnetic resonance apparatus 10 comprises a housing unit 17 enclosing the magnet unit 11.

The magnet unit 11 also comprises a gradient coil 18 for generating magnetic field gradients which are used for spatial encoding during imaging. The gradient coil 18 is controlled by means of a gradient control unit 19. The magnet unit 11 also comprises a radio-frequency antenna 20 and a radio-frequency antenna unit 21 to excite a polarization which becomes established in the main magnetic field 13 generated by the main magnet 11. The radio-frequency antenna 20 is controlled by the radio-frequency antenna unit 21 and emits radio-frequency magnetic resonance sequences into an examination space which is substantially formed by the receiving region 14. This causes the magnetization to be deflected from its state of equilibrium. The radio-frequency antenna unit 21 also receives magnetic resonance signals.

In order to control the main magnet 12, the gradient control unit 19 and the radio-frequency antenna unit 21, the magnetic resonance apparatus 10 has a control unit 22 formed by a computing unit. The computing unit controls the magnetic resonance apparatus 10 centrally, such as, for example, the performance of a predetermined imaging gradient echo sequence. Control information, such as, for example, imaging parameters, and reconstructed magnetic resonance images can be displayed to a user on a display unit 23, for example on at least one monitor, of the magnetic resonance apparatus 10. The magnetic resonance apparatus 10 also comprises an input unit 24 which a user can use to input information and/or parameters during a measuring process.

Obviously, the magnetic resonance apparatus 10 shown can comprise further components commonly found in magnetic resonance apparatuses 10. Furthermore, the general mode of operation of a magnetic resonance apparatus 10 is known to the person skilled in the art so that no detailed description of the general components will be given.

FIGS. 2 to 6 show a noise prevention unit 30 of the magnetic resonance apparatus 10 in more detail. The noise prevention unit 30 is arranged in an interspace 31 and/or intermediate gap between the housing unit 17 and the magnet unit 11. For this purpose, the noise prevention unit 30 comprises a plurality of noise prevention elements 32, each of which is made of insulating foam, which may be flexible foam, viscoelastic foam and/or integral foam with a low Shore hardness, etc.

Figure 2:
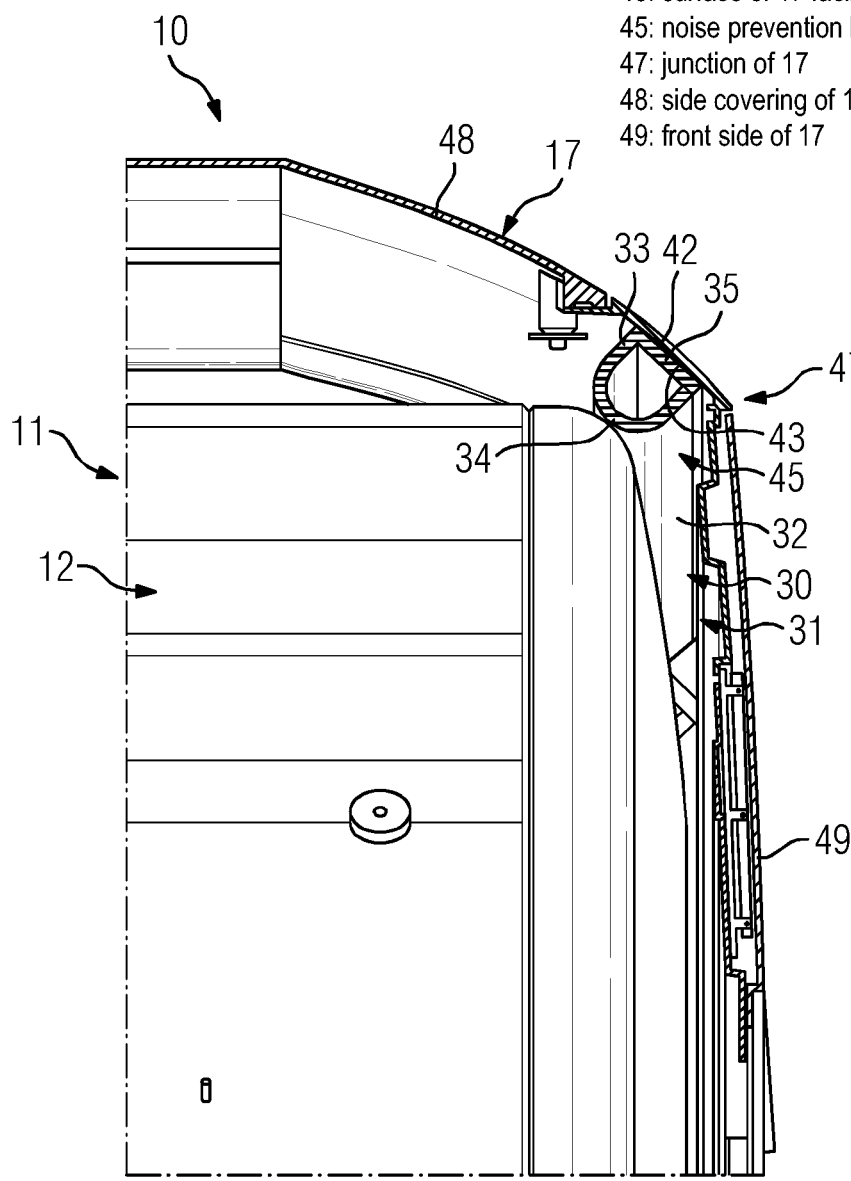
FIG. 2 shows a subregion of the magnetic resonance apparatus with a noise prevention unit.
Figure 3:
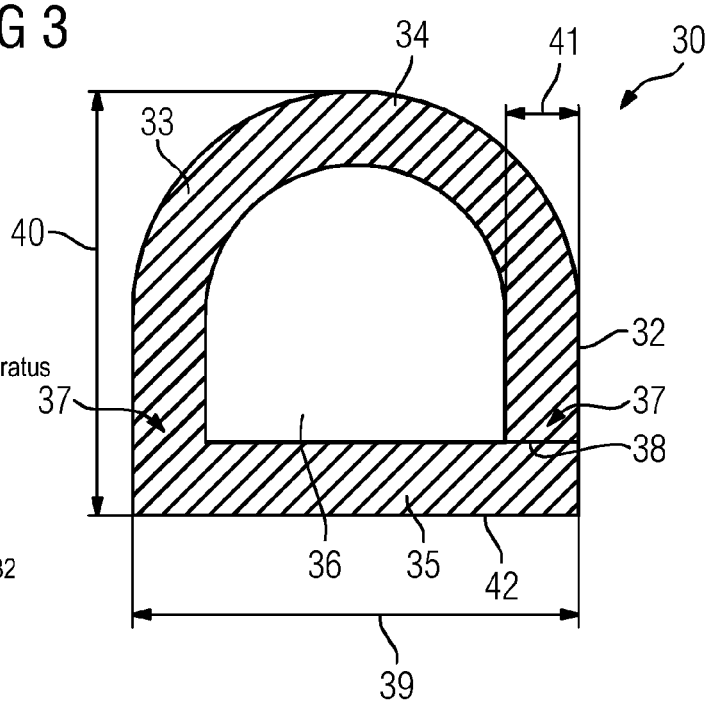
FIG. 3 shows a noise prevention element of the noise prevention unit in a sectional view.

The noise prevention elements 32 each have a cross-sectional area embodied in a D shape (FIGS. 2 and 3). Along its cross-sectional area 33, each of the noise prevention elements 32 has a U-shaped subregion 34 and bar-shaped subregion 35 which together form the D-shaped cross-sectional area with a central recess 36. The noise prevention elements 32 also each comprise two connecting regions 37 arranged between the U-shaped subregion 34 and the bar-shaped subregion 35. A first of these two connecting regions 37 is embodied continuously with the U-shaped subregion 34 and the bar-shaped subregion 35, such that the noise prevention elements 32 are constructed in a single piece. The second of these two connecting regions 37 has a bonding point 38 at which the U-shaped subregion 34 is bonded to the bar-shaped subregion 35 so that the noise prevention elements 32 with the U-shaped subregions 34 and the bar-shaped subregions 35 in each case have a firmly closed D-shape completely enclosing the centrally arranged recess 36 along the cross-sectional area 33.

The noise prevention elements 32 each have a width 39 of approximately 60 mm, wherein the width 39 extends along a length of the bar-shaped subregion 35 within the D-shaped cross-sectional area 33. The noise prevention elements 32 also each have a height 40 of approximately 70 mm, wherein the height 40 extends substantially perpendicularly to the width 39 within the D-shaped cross-sectional area 33. Noise prevention elements 32 of this kind may, for example, be used as a noise prevention barrier in a front region of the magnetic resonance apparatus 10. In order to use the noise prevention elements 32 in a rear region of the magnetic resonance apparatus 10, the noise prevention elements 32 can also have a width 39 of approximately 90 mm and a height 40 of approximately 50 mm. A noise prevention element 32 having such dimensions can be used as an effective noise prevention barrier in different magnetic resonance devices 10, wherein in this case an intermediate gap and/or am interspace 31 between the magnet unit 11 and the housing unit 17 enclosing the magnet unit 11 can be between 50 mm and 70 mm. The noise prevention elements 32 also have a uniform wall thickness 41, which may be, for example, at least 10 mm.

For alternative embodiments of magnetic resonance devices 10 with a larger or smaller intermediate gap and/or interspace 31 between the magnet unit 11 and the housing unit 17 enclosing the magnet unit 11, the noise prevention elements 32 of the noise prevention unit 30 can also have a width 39 of greater or less than 60 mm. Furthermore, it is also possible in this case for the height 40 of the noise prevention elements 32 to differ from the height 40 of approximately 70 mm. For example, noise prevention elements 32 can have a width 39 of approximately 160 mm and a height 40 of approximately 170 mm. In addition, with such dimensions for the noise prevention elements 32, a wall thickness 41 can be, for example, between 20 mm and 25 mm.

The individual noise prevention elements 32 each have a fixing surface 42 for fixing the noise prevention elements 32 to a surface 43 of the housing unit 17 facing the magnet unit 11. The fixing surface 42 is in this case formed by an outward-facing surface of the bar-shaped subregion 35, wherein the fixing surface 42 in this case faces away from the central recess 36. The fixing surfaces 42 are used to bond the noise prevention elements 32 to the housing unit 17. The U-shaped subregion 34 of the noise prevention elements 32 bear against the magnet unit 11 or are supported on the magnet unit 11. In this way, with the exception of cable bushings and/or fixing elements enabling the housing unit 17 to be fixed to the magnet unit 11, complete, soundproof shielding is achieved in the interspace 31 and/or the intermediate gap between the magnet unit 11 and the housing unit 17 enclosing the magnet unit 11, such that the emission of noise or propagation of sound from this interspace 31 and/or the intermediate gap is prevented.

In addition, owing to their D shape, the noise prevention elements 32 are able to absorb and compensate a force acting on the noise prevention elements 32 such that the onward transmission of this force onto, for example, the housing unit 17 is prevented.

Figure 4:
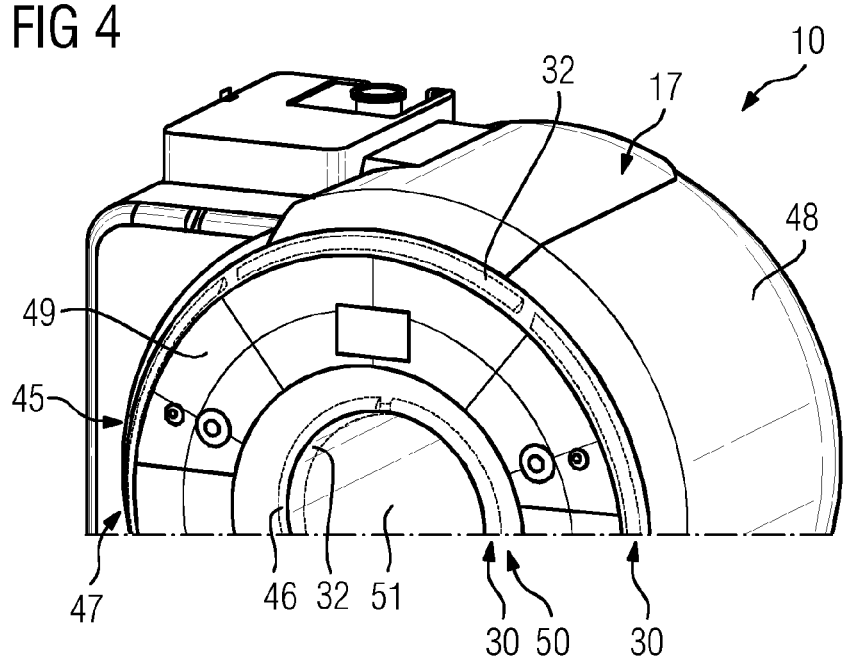
FIG. 4 shows a further view of the magnetic resonance apparatus with the noise prevention unit.
Figure 5:
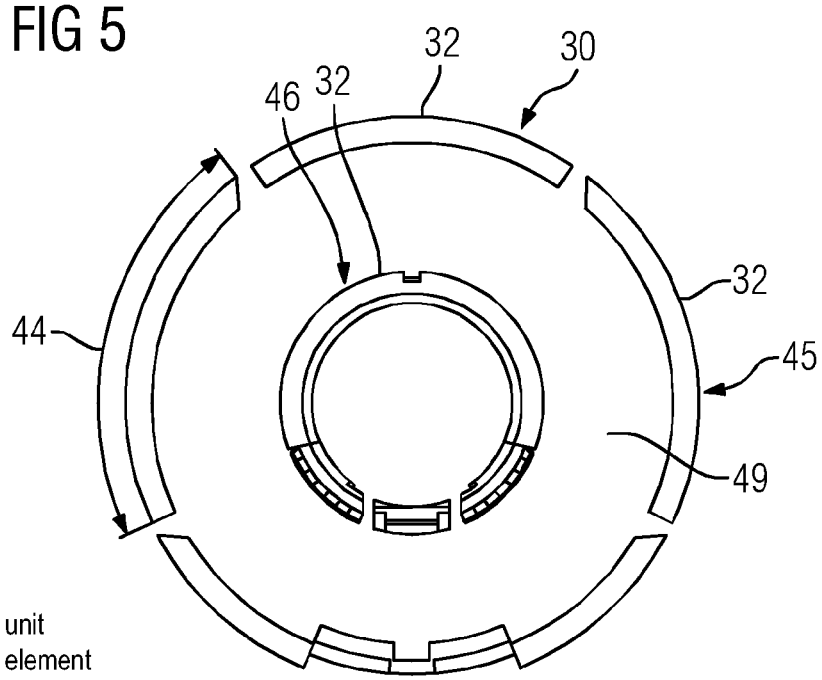
FIG. 5 shows a schematic structure of the noise prevention unit on a front side of the magnetic resonance device.
Figure 6:
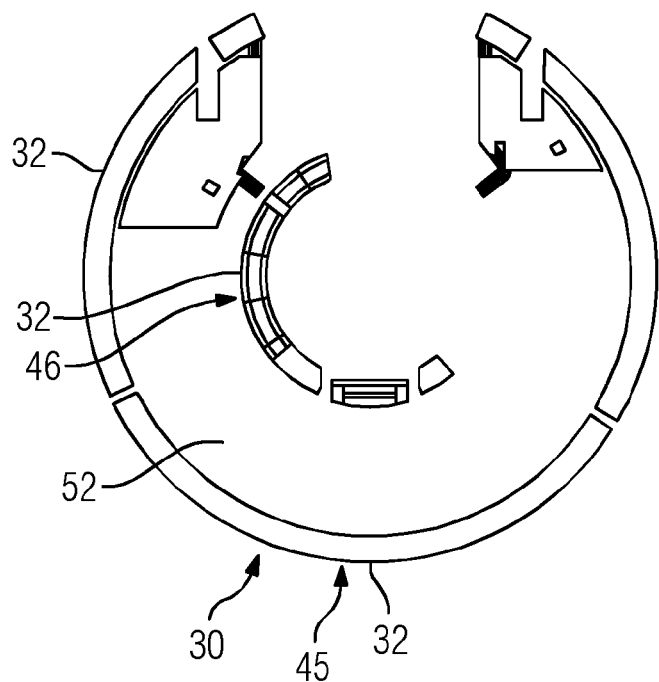
FIG. 6 shows a schematic structure of the noise prevention unit on a rear side of the magnetic resonance device.

In addition, the noise prevention elements 32 have a curved shape along their longitudinal extension 44 such that a plurality of noise prevention elements 32 arranged in series produce a ring-shaped noise prevention barrier 45, 46 (FIGS. 4 to 6). In each case, a first ring-shaped noise prevention barrier 45 of the noise prevention unit 30 is arranged at a junction 47 and/or edge region between a side covering 48 and a front region or a front side 49 of the housing unit on the housing unit 17 inside the magnetic resonance apparatus 10 (FIG. 5). A second ring-shaped noise prevention barrier 46 of the noise prevention unit 30 is arranged at an edge region and/or junction 50 between a patient bore 51 and the front region or the front side of the housing unit 17 on the housing unit 17 (FIG. 5). Similarly, a first ring-shaped noise prevention barrier 45 of the noise prevention unit is also arranged in each case at a junction and/or edge region between the side covering 48 and a rear region or a rear side 52 of the housing unit 17 on the housing unit 17 (FIG. 6). In addition, a second ring-shaped noise prevention barrier 46 of the noise prevention unit 30 is also arranged at an edge region and/or junction between the patient bore 51 and the rear region or the rear side 52 of the housing unit 17 on the housing unit 17 (FIG. 6).

The ring-shaped noise prevention barriers 45, 46 are at least partially formed by closed rings which are interrupted only at points at which retaining elements and/or fixing elements for fixing the housing unit 17 on the magnet unit 11 (FIGS. 5 and 6) are arranged. The ring-shaped noise prevention barriers 45, 46 on the rear side 52 form open rings, since, for example, a supply lead and/or cabling for the gradient coil 18 and/or the radio-frequency antenna unit 21 or supply leads for cooling the magnet unit 11 are arranged here.

Figure 7:
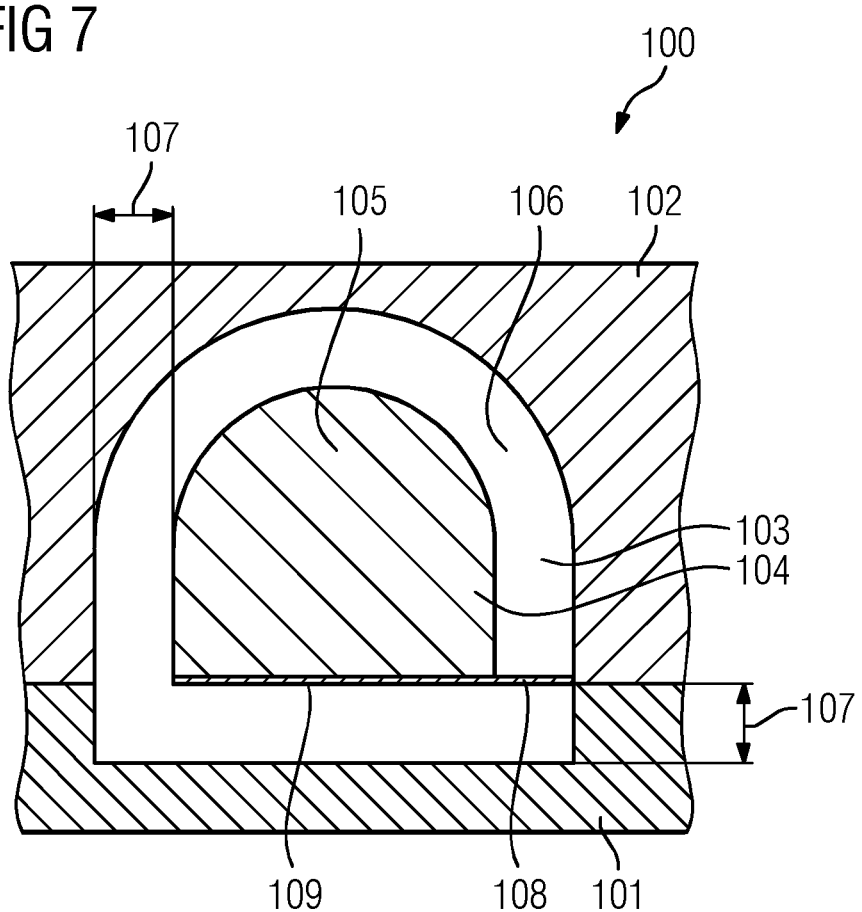
FIG. 7 shows a schematic view of a mold for producing a D-shaped noise prevention element.

FIG. 7 shows a schematic view of a mold apparatus 100 for producing the D-shaped noise prevention elements 32. The mold apparatus 100 comprises a lower mold 101 and an upper mold 102, wherein, in a closed position, the lower mold 101 and the upper mold 102 produce a D-shaped cavity 103. In the closed position, the lower mold 101 with a side with an open shape bears against the side of the upper mold 102 with an open shape. The lower mold 101 and the upper mold 102 each form a half mold for producing the D-shaped noise prevention elements 32.

In addition, the mold apparatus 100 comprises a D-shaped insert mold 104, wherein the D-shaped insert mold 104 has a smaller cross-sectional area 105 than a cross-sectional area 106 of the D-shaped cavity 103. In this case the D-shaped insert mold 104 is arranged centrally within the D-shaped cavity 103. In this context, arranged centrally shall in particular be understood to mean that the D-shaped insert mold 104 is arranged at the same distance from a mold surface of the upper mold 102 and of the lower mold 101. To this end, the D-shaped insert mold 104 is arranged at end regions (not depicted in any further detail) with the lower mold 101 or the upper mold 102 in such a way that the D-shaped insert mold 104 can be folded out from the lower mold 101 or the upper mold 102.

In the closed position of the mold apparatus 100, the D-shaped insert mold 104 is arranged at a distance 107 of at least 10 mm from the lower mold 101 and the upper mold 102 within the D-shaped cavity 103. This enables the noise prevention elements 32 to be produced with a uniform wall thickness 41 of at least 10 mm in a production method.

The D-shaped insert mold 104 also has a separating land 108, which, in a closed position of the mold apparatus 100, passes through the D-shaped cavity 103 at one point such that, following the production of the noise prevention elements 32, they can be removed particularly easily from the mold apparatus 100 and the two subregions 34, 35 of the noise prevention elements 32 can be bonded together particularly easily and exactly at this point. In this case the separating land 108 comprises a parting surface which, together with a non-curved surface of the D-shaped insert mold 104, forms a non-curved overall surface 109. In the closed position of the mold apparatus 100, the non-curved surface of the D-shaped insert mold 104 faces toward the lower mold 101.

In the closed mold apparatus 100, the D-shaped cavity 103 has a curved shape along its longitudinal extension. In addition, the D-shaped insert mold 104 also has a curved shape along its longitudinal extension. The D-shaped cavity 103 has a length of approximately 1.5 m (not shown in any more detail in FIG. 7).

In order to produce the noise prevention elements 32, the D-shaped insert mold 104 is inserted in the lower mold 101. The mold apparatus 100 is then filled with the foam components, such as, for example, polyol and isocyanate. In a next step the mold apparatus 100 is closed and the foam components are foamed. The noise prevention element 32 is thereupon removed from the mold apparatus and at the same time pulled from the D-shaped insert mold 104. After the removal of the noise prevention elements 32, the connecting region 37 of the noise prevention element 32, which is interrupted by the separating land 108, is bonded.

While specific embodiments have been described in detail, those with ordinary skill in the art will appreciate that various modifications and alternative to those details could be developed in light of the overall teachings of the disclosure. For example, elements described in association with different embodiments may be combined. Accordingly, the particular arrangements disclosed are meant to be illustrative only and should not be construed as limiting the scope of the claims or disclosure, which are to be given the full breadth of the appended claims, and any and all equivalents thereof. It should be noted that the term "comprising" does not exclude other elements or steps and the use of articles "a" or "an" does not exclude a plurality.

The invention claimed is:

1. A magnetic resonance apparatus, comprising:
   a magnet unit,
   a housing unit enclosing the magnet unit, and
   a noise prevention unit which is arranged in either an interspace, or an intermediate gap, between the magnet unit and the housing unit,
   wherein the noise prevention unit comprises at least one noise prevention element made of an insulating foam,
   wherein the at least one noise prevention element has a D-shaped cross-sectional area,
   wherein the D-shaped cross-sectional area is configured to reduce sound propagation within either the interspace or the intermediate gap, between the magnet unit and the housing unit,
   wherein the D-shaped cross-sectional area also comprises a bar-shaped subregion made of the insulating foam,
   wherein the at least one noise prevention element comprises a fixing surface configured for bonding the at least one noise prevention element onto a surface of the housing unit facing the magnet unit,
   wherein the fixing surface is formed by an outward-facing surface of the bar-shaped subregion of the at least one noise prevention element.

2. The magnetic resonance apparatus as claimed in claim 1, wherein the at least one noise prevention element is constructed as a single piece.

3. The magnetic resonance apparatus as claimed in claim 1, wherein the at least one noise prevention element also comprises a U-shaped subregion and two connecting regions located between the U-shaped subregion and the bar-shaped subregion, wherein one of the two connecting regions has a bonding point positioned between the U-shaped subregion and the bar-shaped subregion.

4. The magnetic resonance apparatus as claimed in claim 1, wherein the at least one noise prevention element has a width of approximately 60 mm.

5. The magnetic resonance apparatus as claimed in claim 1, wherein the at least one noise prevention element has a height of approximately 70 mm.

6. The magnetic resonance apparatus as claimed in claim 1, wherein the at least one noise prevention element has a thickness of at least 10 mm.

7. The magnetic resonance apparatus as claimed in claim 3, wherein the at least one noise prevention element also comprises a U-shaped subregion that bears at least partially against the magnet unit.

8. The magnetic resonance apparatus as claimed in claim 1, wherein the at least one noise prevention element also has a curved shape along its longitudinal extension.

9. The magnetic resonance apparatus as claimed in claim 1, wherein the noise prevention unit comprises a plurality of the at least one noise prevention elements of claim 1 which are arranged in order to form a ring-shaped noise prevention barrier.

10. The magnetic resonance apparatus as claimed in claim 9, wherein the ring-shaped noise prevention barrier is arranged at an edge region and/or junction between a side covering and at least a front side and/or rear side of the housing unit.

11. The magnetic resonance apparatus as claimed in claim 9, wherein the ring-shaped noise prevention barrier is arranged at an edge region and/or junction between a patient bore and at least a front side and/or rear side of the housing unit.

12. A mold apparatus configured for producing a D-shaped noise prevention element made of insulating foam that is compatible with magnetic resonance imaging, the mold apparatus comprising:
   a lower mold and an upper mold which, when in a closed position with respect to each other, produce a D-shaped cavity, and
   a D-shaped insert mold, wherein the D-shaped insert mold has a smaller cross-sectional area than a cross-sectional area of the D-shaped cavity,
   wherein the D-shaped noise prevention element is arranged in either an interspace, or an intermediate gap, between a magnet unit and a housing unit of a magnetic resonance apparatus,
   wherein the D-shaped cross-sectional area is configured in order to reduce sound propagation within either the interspace or the intermediate gap, between the magnet unit and the housing unit of the magnetic resonance apparatus,
   wherein the D-shaped noise prevention element comprises a bar-shaped subregion made of the insulating foam,
   wherein the D-shaped noise prevention element also comprises a fixing surface configured for bonding the D-shaped noise prevention element onto a surface of the housing unit facing the magnet unit, and
   wherein the fixing surface is formed by an outward-facing surface of the bar-shaped subregion of the D-shaped noise prevention element.

13. The mold apparatus as claimed in claim 12, wherein the D-shaped insert mold is arranged centrally within the D-shaped cavity.

14. The mold apparatus as claimed in claim 12, wherein the D-shaped insert mold is arranged at a distance of at least 10 mm from the lower mold and/or the upper mold within the D-shaped cavity.

15. The mold apparatus as claimed in claim 12, wherein the D-shaped insert mold has a separating land which passes through the D-shaped cavity at one point.

16. The mold apparatus as claimed in claim 15, wherein the separating land comprises a parting surface, which, together with a non-curved surface of the D-shaped insert mold, forms a non-curved overall surface.

* * * * *